(12) United States Patent
Herner

(10) Patent No.: US 8,981,347 B2
(45) Date of Patent: Mar. 17, 2015

(54) MEMORY CELL THAT INCLUDES A SIDEWALL COLLAR FOR PILLAR ISOLATION AND METHODS OF FORMING THE SAME

(71) Applicant: SanDisk 3D LLC, Milpitas, CA (US)

(72) Inventor: Scott Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/182,264

(22) Filed: Feb. 17, 2014

(65) Prior Publication Data

US 2014/0158975 A1   Jun. 12, 2014

Related U.S. Application Data

(62) Division of application No. 13/868,667, filed on Apr. 23, 2013, now Pat. No. 8,679,901, which is a division of application No. 12/698,761, filed on Feb. 2, 2010, now Pat. No. 8,431,492.

(51) Int. Cl.
| | |
|---|---|
| *H01L 29/06* | (2006.01) |
| *H01L 29/08* | (2006.01) |
| *H01L 45/00* | (2006.01) |
| *G11C 17/16* | (2006.01) |
| *H01L 27/102* | (2006.01) |
| *H01L 27/24* | (2006.01) |
| *G11C 13/00* | (2006.01) |
| *G11C 13/02* | (2006.01) |

(52) U.S. Cl.
CPC .............. *H01L 45/124* (2013.01); *G11C 17/16* (2013.01); *H01L 27/1021* (2013.01); *H01L 27/2409* (2013.01); *H01L 27/2481* (2013.01); *H01L 27/2418* (2013.01); *H01L 45/16* (2013.01); *G11C 13/0002* (2013.01); *G11C 13/0007* (2013.01); *G11C 13/025* (2013.01); *G11C 2213/35* (2013.01); *G11C 2213/72* (2013.01); *H01L 45/1233* (2013.01); *H01L 45/146* (2013.01); *H01L 45/149* (2013.01); *H01L 45/1675* (2013.01); *H01L 45/04* (2013.01)

USPC .............. 257/37; 257/530; 257/537; 257/653

(58) Field of Classification Search
USPC .................... 257/37, 530, 537, 653
See application file for complete search history.

(56) References Cited

U.S. PATENT DOCUMENTS

| | | | |
|---|---|---|---|
| 5,915,167 | A | 6/1999 | Leedy |
| 6,952,030 | B2 | 10/2005 | Herner |
| 7,176,064 | B2 | 2/2007 | Herner |
| 7,405,465 | B2 | 7/2008 | Herner |

(Continued)

OTHER PUBLICATIONS

Dhong et al., "Sidewall Spacer Technology for MOS and Bipolar Devices", Feb. 1986, J. Electrochem. Soc.: Solid-State Science and Technology, vol. 133, No. 2; pp. 389-396.

(Continued)

*Primary Examiner* — Ngan Ngo
(74) *Attorney, Agent, or Firm* — Dugan & Dugan, PC

(57) ABSTRACT

A method of forming a memory cell is provided. The method includes forming a steering element pillar having a first stiffness and a sidewall, forming a sidewall collar along at least a portion of the sidewall of the steering element pillar, the sidewall collar having a second stiffness, wherein the second stiffness is greater than the first stiffness, and forming a memory element coupled to the steering element pillar. Numerous other aspects are provided.

20 Claims, 12 Drawing Sheets

(56) References Cited

U.S. PATENT DOCUMENTS

| | | | |
|---|---|---|---|
| 8,039,958 | B2 | 10/2011 | Platz et al. |
| 2004/0007779 | A1 | 1/2004 | Arbuthnot et al. |
| 2006/0249753 | A1 | 11/2006 | Herner et al. |
| 2006/0250837 | A1 | 11/2006 | Herner |
| 2007/0190722 | A1 | 8/2007 | Herner |
| 2007/0246782 | A1 | 10/2007 | Philipp et al. |
| 2007/0279974 | A1 | 12/2007 | Dennison et al. |
| 2008/0315359 | A1 | 12/2008 | Happ et al. |
| 2009/0004786 | A1* | 1/2009 | Radigan et al. ............... 438/128 |
| 2009/0176354 | A1 | 7/2009 | Rajendran et al. |
| 2009/0230505 | A1* | 9/2009 | Dennison ..................... 257/522 |
| 2009/0258489 | A1 | 10/2009 | Chen et al. |
| 2009/0298224 | A1 | 12/2009 | Lowrey |
| 2009/0302296 | A1* | 12/2009 | Fuchigami et al. ............... 257/2 |
| 2009/0316467 | A1 | 12/2009 | Liu |
| 2010/0019215 | A1 | 1/2010 | Lung et al. |
| 2010/0019221 | A1 | 1/2010 | Lung et al. |
| 2010/0151635 | A1 | 6/2010 | Chung |
| 2011/0031460 | A1 | 2/2011 | Dennison |
| 2011/0186797 | A1 | 8/2011 | Herner |
| 2011/0217818 | A1 | 9/2011 | Lung et al. |
| 2013/0234104 | A1 | 9/2013 | Herner |

OTHER PUBLICATIONS

Kim et al., "A Mechanically Enhanced Storage Node for Virtually Unlimited Height (MESH) Capacitor Aiming at Sub 70nm DRAMs", 2004, IEEE, pp. 1-4.
International Search Report and Written Opinion of counterpart International Application No. PCT/US2011/022091 mailed May 19, 2011.
Restriction Requirement in related U.S. Appl. No. 12/698,761 mailed Jan. 27, 2012.
Jan. 30, 2012 Response to Jan. 27, 2012 Restriction Requirement in related U.S. Appl. No. 12/698,761.
Office Action in related U.S. Appl. No. 12/698,761 mailed Mar. 1, 2012.
Jun. 1, 2012 Response to Mar. 1, 2012 Office Action in related U.S. Appl. No. 12/698,761.
Final Office Action in related U.S. Appl. No. 12/698,761 mailed Jul. 30, 2012.
Communication pursuant to Rules 161(1) and 162 EPC of counterpart European Application 11702105.5 mailed Sep. 11, 2012.
Oct. 31, 2012 Response to Jul. 30, 2012 Final Office Action in related U.S. Appl. No. 12/698,761.
Advisory Action in related U.S. Appl. No. 12/698,761 mailed Nov. 15, 2012.
Nov. 30, 2012 RCE and Response to Jul. 30, 2012 Final Office Action in related U.S. Appl. No. 12/698,761.
Notice of Allowance in related U.S. Appl. No. 12/698,761 mailed Jan. 3, 2013.
Mar. 21, 2013 Reply to Sep. 11, 2012 Communication pursuant to Rules 161(1) and 162 EPC of counterpart European Application 11702105.5.
Restriction Requirement in related U.S. Appl. No. 13/868,667 mailed Aug. 2, 2013.
Aug. 30, 2013 Response to Aug. 2, 2013 Restriction Requirement in related U.S. Appl. No. 13/868,667.
Notice of Allowance in related U.S. Appl. No. 13/868,667 dated Nov. 1, 2013.

* cited by examiner

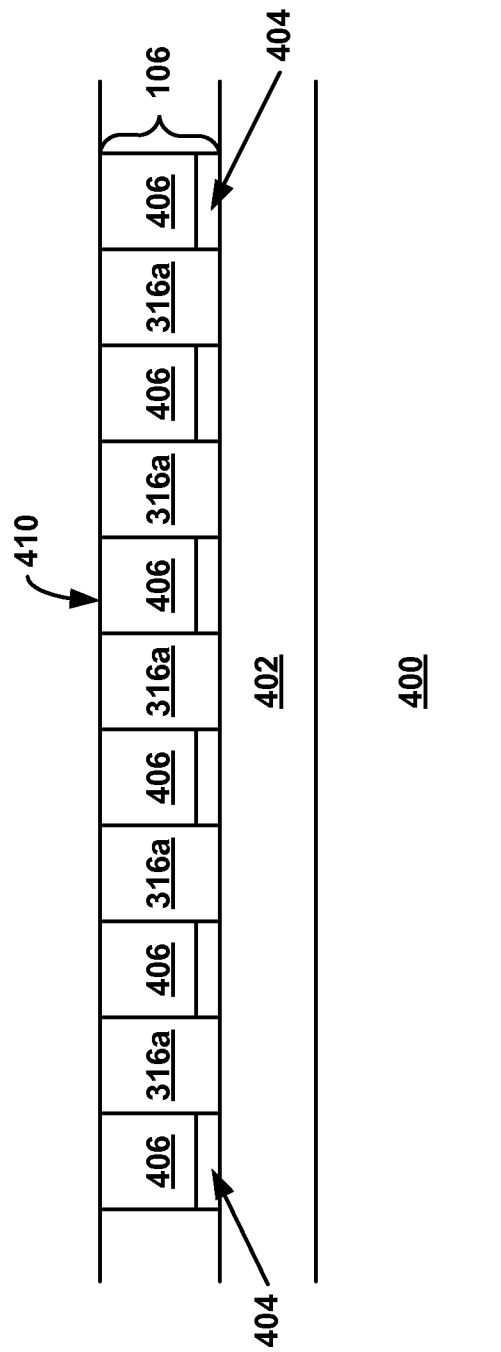

US 8,981,347 B2

MEMORY CELL THAT INCLUDES A SIDEWALL COLLAR FOR PILLAR ISOLATION AND METHODS OF FORMING THE SAME

REFERENCE TO RELATED APPLICATIONS

This application is a division of and claims priority to U.S. patent application Ser. No. 13/868,667, filed Apr. 23, 2013, which is a division of and claims priority to U.S. patent application Ser. No. 12/698,761, filed Feb. 2, 2010, now U.S. Pat. No. 8,431,492, each of which is incorporated by reference herein in its entirety for all purposes.

BACKGROUND

This invention relates to non-volatile memories, and more particularly to a memory cell that includes a sidewall collar for pillar isolation, and methods of forming the same.

Memory devices may be fabricated by forming an array of memory cells above a substrate. For example, U.S. Patent Publication No. 2006/0249753, published Nov. 9, 2006, titled "High-Density Nonvolatile Memory Array Fabricated at Low Temperature Comprising Semiconductor Diodes," (the "'753 Application") which is hereby incorporated by reference herein in its entirety for all purposes, describes a method device of fabricating a memory device including a plurality of memory cells.

However, fabricating arrays of memory cells is technically challenging, and improved methods of forming memory devices are desirable.

SUMMARY

In a first embodiment of the invention, a method of forming a memory cell is provided that includes (a) forming one or more layers of steering element material above a substrate; (b) etching a portion of the steering element material to form a pillar of steering element material having an exposed sidewall; (c) forming a sidewall collar along the exposed sidewall of the pillar; and (d) forming a memory cell using the pillar.

In a second embodiment of the invention, a method of forming a memory array is provided that includes (a) forming one or more layers of steering element material above a substrate; (b) etching a portion of the steering element material to form a plurality of pillars of steering element material, each pillar having an exposed sidewall; (c) forming a sidewall collar along the exposed sidewall of each pillar; and (d) forming a plurality of memory cells using the pillars.

In a third embodiment of the invention, a method of forming a memory cell is provided that includes (a) forming a steering element pillar having a first stiffness and a sidewall; (b) forming a sidewall collar along at least a portion of the sidewall of the steering element pillar, the sidewall collar having a second stiffness, wherein the second stiffness is greater than the first stiffness; and (c) forming a memory element coupled to the steering element pillar.

In a fourth embodiment of the invention, a method of forming a memory array is provided that includes (a) forming a plurality of steering element pillars each having a first stiffness and a sidewall; (b) forming a sidewall collar along at least a portion of the sidewall of each steering element pillar, each sidewall collar having a second stiffness, wherein the second stiffness is greater than the first stiffness; and (c) forming a plurality of memory elements each coupled to a different one of the steering element pillars.

In a fifth embodiment of the invention, a memory cell is provided that includes (a) a steering element pillar having a sidewall; (b) a sidewall collar formed along at least a portion of the sidewall of the steering element pillar; and (c) a memory element coupled to the steering element pillar.

In a sixth embodiment of the invention, a memory array is provided that includes (a) a plurality of steering element pillars, each having a sidewall; (b) a plurality of sidewall collars, each formed along at least a portion of the sidewall of a respective one of the steering element pillars; and (c) a plurality of memory elements, each coupled to a respective one of the steering element pillars.

In a seventh embodiment of the invention, a memory cell is provided that includes (a) a steering element pillar having a first stiffness and a sidewall; (b) a sidewall collar formed along at least a portion of the sidewall of the steering element pillar, the sidewall collar having a second stiffness, wherein the second stiffness is greater than the first stiffness; and (c) a memory element coupled to the steering element pillar.

In an eighth embodiment of the invention, a memory array is provided that includes (a) a plurality of steering element pillars each having a first stiffness and a sidewall; (b) a sidewall collar along at least a portion of the sidewall of each steering element pillar, each sidewall collar having a second stiffness, wherein the second stiffness is greater than the first stiffness; and (c) a plurality of memory elements each coupled to a different one of the steering element pillars. Numerous other embodiments are provided.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 4A-4I illustrates cross-sectional views of a portion of a substrate during example fabrication of a single memory level in accordance with this invention.

DETAILED DESCRIPTION

As stated, memory devices may be fabricated by forming an array of memory cells above a substrate. For example, the '753 Application describes a method of forming a plurality of memory cells that each include a steering element and a dielectric rupture antifuse. In some embodiments, each memory cell includes a pillar formed from a vertical p-i-n diode in series with a metal-insulator-metal ("MIM") stack that includes the antifuse. The space between the pillars of the memory array may be filled with an insulating gap fill material, such as silicon dioxide. However, there is a risk that before the gap fill material is deposited, one or more pillars may lean, fall or otherwise make contact with an adjacent pillar. Contact between adjacent pillars can cause the memory array to be defective.

In accordance with one or more embodiments of the present invention, an insulating collar or spacer is provided around a portion of each memory cell pillar. The insulating collar may strengthen each pillar, making each pillar less likely to lean and/or touch another pillar. For example, in some embodiments, each memory cell includes a vertical diode formed from a pillar of deposited silicon, and a portion of each pillar is surrounded by a silicon nitride or similar collar. Because silicon nitride is "stiffer" than silicon, the silicon nitride provides additional structural support for each pillar. The silicon nitride also increases the probability of good electrical isolation between pillar devices. Other collar materials may be used such as silicon carbide, hafnium oxide, or the like. Such a collar may also slow down the rate of chemical mechanical polishing of the gap fill material once the collar is exposed, thereby providing better manufacturing control of pillar height.

As will be described further below, use of an insulating collar also reduces the likelihood of inadvertent short circuiting of a memory cell due to misalignment during formation of electrical contacts to the memory cell.

Example Embodiments of Memory Cells and Memory Arrays

Figure 1:
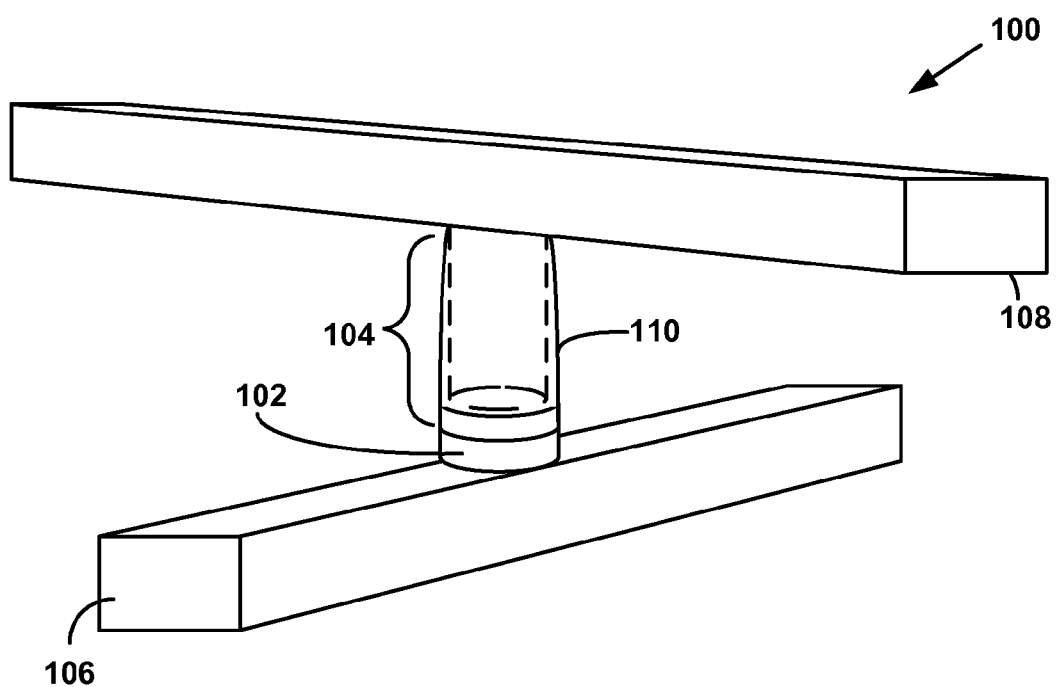
FIG. 1 is a simplified perspective view of an example memory cell provided in accordance with the present invention.

FIG. 1 is a simplified perspective view of an example embodiment of a memory cell 100 provided in accordance with the present invention. Memory cell 100 includes a memory element 102 coupled in series with a "pillar" steering element 104 between a first conductor 106 and a second conductor 108. A portion of steering element 104 is shown in phantom. Various barrier and/or adhesion layers (not shown) may be formed between steering element 104 and second conductor 108, between steering element 104 and memory element 102, and/or between memory element 102 and first conductor 106. Example barrier and/or adhesion layers may include, for example, titanium nitride, tantalum nitride, tungsten, tungsten nitride, molybdenum, combinations of the same, or another similar layer. In some embodiments, a barrier/adhesion layer may be formed as part of first conductor 106 and/or second conductor 108.

As shown in FIG. 1, steering element 104 forms a pillar structure (e.g., a steering element pillar) that extends toward second conductor 108. In at least some embodiments, all or a portion of steering element 104 is surrounded by a sidewall liner or "collar" 110. Sidewall collar 110 may include silicon nitride, silicon carbide, a high k material such as $HfO_2$, or another electrically insulating material that strengthens, protects and/or electrically isolates steering element 104. Sidewall collar 110 may strengthen steering element 104, preventing it from tipping during fabrication of memory cell 100, and may also protect steering element 104 from being shorted out during fabrication of second conductor 108, such as when a damascene wiring process is used to form second conductor 108 (as described further below).

Memory element 102 may include any suitable memory element. In some embodiments, memory element 102 may include a dielectric rupture antifuse formed from silicon dioxide, hafnium oxide, or any other suitable material. In other embodiments, memory element 102 may include a reversible resistance switching element formed from a reversible resistance switching material such as amorphous carbon or another carbon-based material such as graphene, graphite, carbon nanotube materials, amorphous diamond-like carbon, silicon carbide, boron carbide, a metal oxide such as nickel or titanium oxide, etc. Any suitable memory element may be employed.

Steering element 104 may include a diode, for example. In this discussion, steering element 104 is sometimes referred to as "diode 104." Diode 104 may include any suitable diode such as a vertical polycrystalline p-n or p-i-n diode, whether upward pointing with an n-region above a p-region of the diode or downward pointing with a p-region above an n-region of the diode.

First conductor 106 and/or second conductor 108 may include any suitable conductive material such as tungsten, any appropriate metal, heavily doped semiconductor material, a conductive silicide, a conductive silicide-germanide, a conductive germanide, or the like. In the example of FIG. 1, first and second conductors 106 and 108, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 106 and/or second conductor 108 to improve device performance and/or aid in device fabrication.

In some embodiments, memory cell 100 may be formed in an initial high-resistance state, and when a read voltage is applied between first conductor 106 and second conductor 108, little or no current flows between them. Upon application of a programming voltage, however, memory cell 100 may be converted to a low-resistance state. In this low-resistance state, when the read voltage is applied between first conductor 106 and second conductor 108, a larger (e.g., reliably detectable) current flows. The initial high-resistance state may correspond to, for example, a data "0," whereas the programmed low-resistance state corresponds to a data "1." In other embodiments, the memory cell 100 may be formed in an initial low-resistance state that is changeable to a high-resistance state via application of a programming voltage.

Figure 2A:
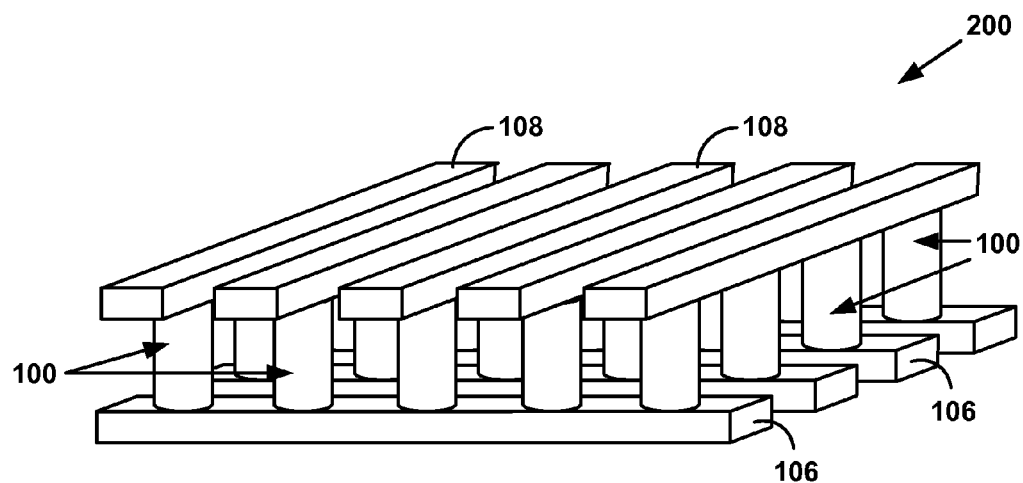
FIG. 2A is a simplified perspective view of a portion of a first example memory level formed from a plurality of the memory cells of FIG. 1.

FIG. 2A is a simplified perspective view of a portion of a first memory level 200 formed from a plurality of memory cells 100, such as memory cells 100 of FIG. 1. For simplicity, memory element 102 and diode 104 are not separately shown. Memory array 200 is a "cross-point" array including a plurality of bit lines (second conductors 108) and word lines (first conductors 106) to which multiple memory cells are coupled (as shown). Other memory array configurations may be used, as may multiple levels of memory.

Figure 2B:
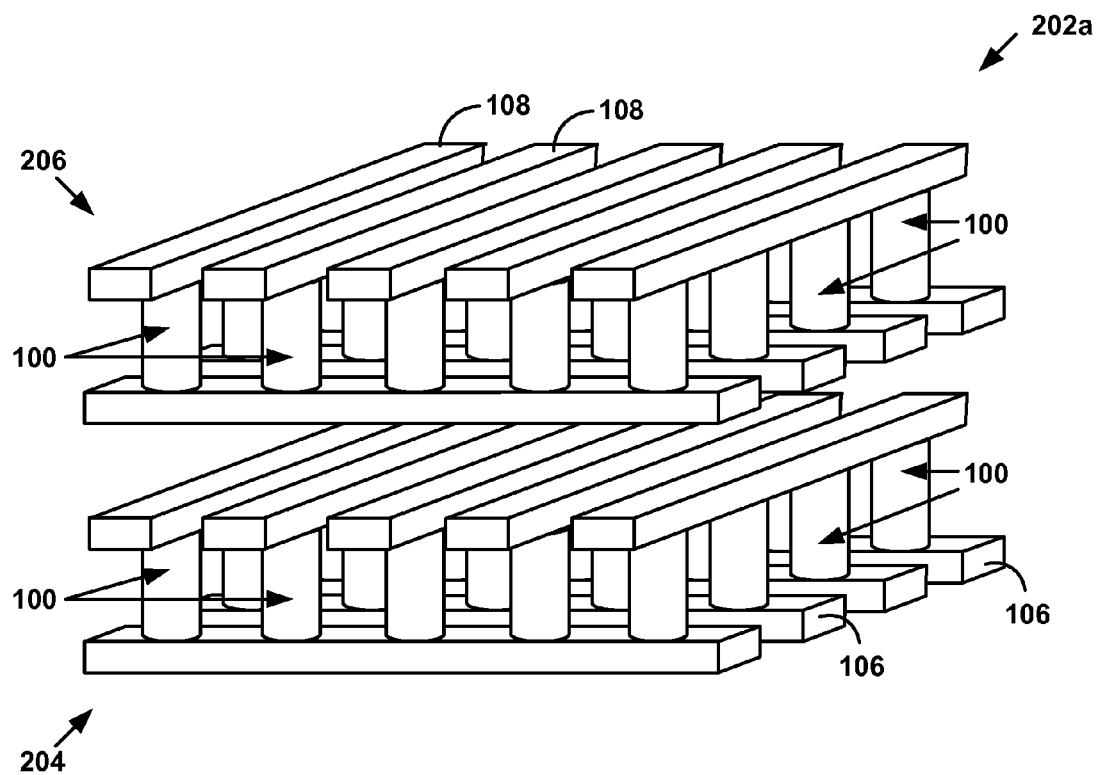
FIG. 2B is a simplified perspective view of a portion of a first example three-dimensional memory array provided in accordance with this invention.

For example, FIG. 2B is a simplified perspective view of a portion of a monolithic three dimensional array 202a that includes a first memory level 204 positioned below a second memory level 206. Memory levels 204 and 206 each include a plurality of memory cells 100 in a cross-point array. Persons of ordinary skill in the art will understand that additional layers (e.g., an interlevel dielectric) may be present between first and second memory levels 204 and 206, but are not shown in FIG. 2B for simplicity. Other memory array configurations may be used, as may additional levels of memory. In the embodiment of FIG. 2B, all diodes may "point" in the same direction, such as upward or downward depending on whether p-i-n diodes having a p-doped region on the bottom or top of the diodes are employed, simplifying diode fabrication.

Figure 2C:
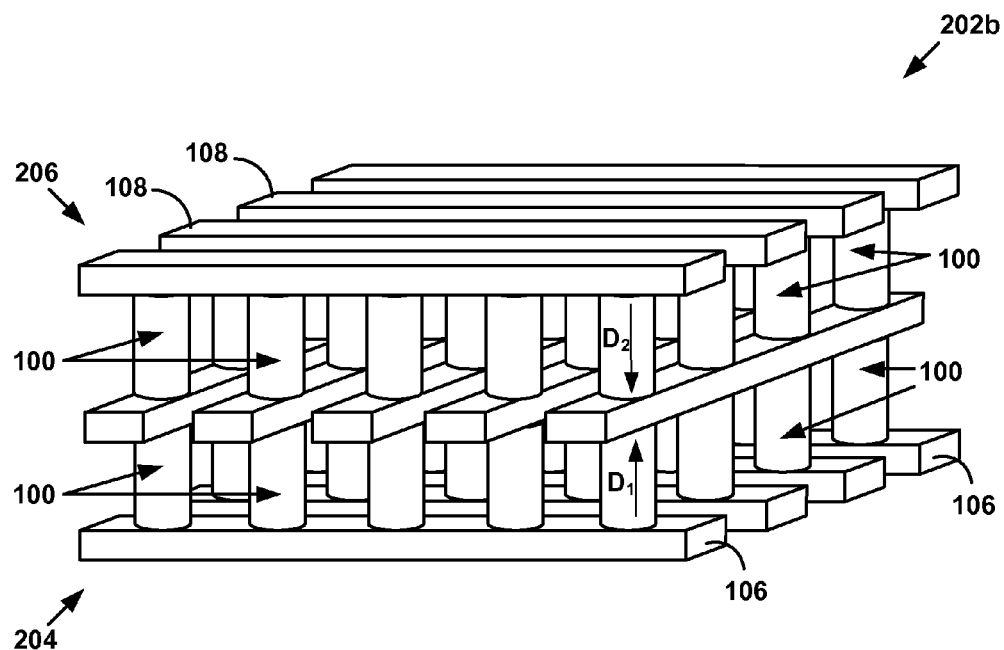
FIG. 2C is a simplified perspective view of a portion of a second example three-dimensional memory array provided in accordance with this invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in a memory array 202b of FIG. 2C. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in FIG. 2C, the diodes of first memory level 204 may be upward pointing diodes as indicated by arrow D1 (e.g., with p regions at the bottom of the diodes), whereas the diodes of second memory level 206 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
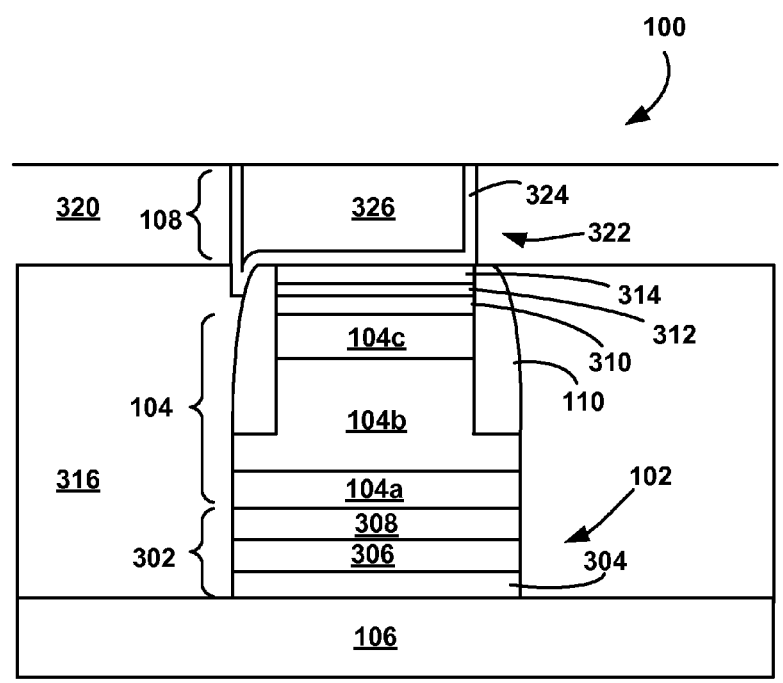
FIG. 3 is a cross-sectional view of an additional example embodiment of a memory cell in accordance with this invention.

FIG. 3 is a cross-sectional view of an example embodiment of memory cell 100 of FIG. 1, in accordance with the invention. In particular, memory cell 100 includes memory element 102, diode 104, and first and second conductors 106 and 108, respectively. Memory element 102 includes MIM stack 302 which may include a first barrier layer 304 positioned above first conductor 106, a storage element material 306 positioned above first barrier layer 304 and a second barrier layer 308 positioned above storage element material 306. Storage element material 306 may include a dielectric rupture antifuse, reversible-resistivity switching material, or another memory element material, whether one-time-programmable or re-writable.

Memory cell 100 may also include a silicide layer 310 and/or a silicide-forming metal layer 312 formed above diode 104. In some embodiments, an additional barrier layer 314 may be formed between diode 104 and second conductor 108. Adhesion layers, antireflective coating layers and/or the like (not shown) may be used with first and/or second conductors 106 and 108, respectively, to improve device performance and/or facilitate device fabrication.

Memory cell 100 also includes sidewall collar 110, which surrounds a portion of diode 104, barrier layer 314, silicide layer 310 and/or silicide-forming metal layer 312. Sidewall collar 110, diode 104, and MIM stack 302 are also surrounded by dielectric material 316, such as silicon dioxide, to isolate memory cell 100 from adjacent memory cells (not shown). Sidewall collar 110 may include silicon nitride, silicon carbide, a high k material such as HfO$_2$, or another electrically insulating material that strengthens, protects and/or electrically isolates memory cell 100/diode 104 during memory array fabrication and prior to formation of the surrounding dielectric material 316.

Sidewall collar 110 is selected to be stiffer than the diode material so that collar 110 mechanically strengthens diode 104, preventing it from tipping during fabrication of memory cell 100 (prior to formation of dielectric material 316). Silicon nitride collar 110 also may protect memory cell 100 from being shorted out during fabrication of the second conductor 108, such as when a damascene wiring process is used to form second conductor 108. For example, as shown in FIG. 3, second conductor 108 may be formed by depositing a dielectric material 320 above diode 104, patterning and etching dielectric material 320 to form a trench 322, depositing a barrier/liner material 324 within trench 322, filling trench 322 with a conductive material 326 and then planarizing the top surface of the resultant structure (e.g., via chemical mechanical polishing or etch back). During such a damascene process, trench 322 is formed by etching the dielectric material 320 until barrier layer 314/diode 104 is exposed. Any misalignment during this etch step may result in etching of dielectric material 316 that surrounds and isolates diode 104, as dielectric materials 316, 320 may be the same material (e.g., silicon dioxide or a similar dielectric). Sidewall collar 110 is formed from a different dielectric material (e.g., silicon nitride, silicon carbide, a high k material, etc.) and protects diode 104 during such etching. For example, when such over-etching occurs, absent sidewall collar 110, deposition of barrier/liner material 324 and/or conductive material 326 may short circuit diode 104. However, presence of sidewall collar 110 insulates diode 104 from metal that penetrates into dielectric material 316 and reduces any shorting risk by isolating the diode 104 and other layers of memory cell 100 from barrier/liner material 324 and/or conductive material 326 as shown in FIG. 3.

In some embodiments, sidewall collar 110 may be formed around the entire height of diode 104. Alternatively, sidewall collar 110 may be formed around only a portion of diode 104 (e.g., an upper portion of diode 104, such as about the upper 200 nanometers of a 300 nanometer high diode, although more of less of diode 104 may include sidewall collar 110). As shown in FIG. 3, in some embodiments, sidewall collar 110 does not extend laterally any further than the widest portion of diode 104. As a result, a first portion of diode 104 may have a first width (the portion surrounded by sidewall collar 110), and a second portion of diode 104 may have a second width (the portion not surrounded by sidewall collar 110) different from the first width.

Barrier layers 304, 308, 314 and 324 may include titanium nitride, tantalum nitride, tungsten, tungsten nitride, molybdenum, combinations of the same, etc. Conductive material 326 may include tungsten or another appropriate metal, heavily doped semiconductor material, a conductive silicide, a conductive silicide-germanide, a conductive germanide, or the like.

As previously stated, diode 104 may be a vertical p-n or p-i-n diode, which may either point upward or downward. In the embodiment of FIG. 2C in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 104 may be formed from a polycrystalline semiconductor material such as polysilicon, a polycrystalline silicon-germanium alloy, polygermanium or any other suitable material. For example, diode 104 may include a heavily doped n+ polysilicon region 104a, a lightly doped or an intrinsic (unintentionally doped) polysilicon region 104b above the n+ polysilicon region 104a, and a heavily doped p+ polysilicon region 104c above intrinsic region 104b. It will be understood that the locations of the n+ and p+ regions may be reversed.

In some embodiments, a thin germanium and/or silicon-germanium alloy layer (not shown) may be formed on n+ polysilicon region 104a to prevent and/or reduce dopant migration from n+ polysilicon region 104a into intrinsic region 104b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes. In some embodiments, a few hundred angstroms or less of silicon-germanium alloy with about 10 atomic percent ("at %") or more of germanium may be employed.

If diode 104 is fabricated from deposited silicon (e.g., amorphous or polycrystalline), a silicide layer 310 may be formed on diode 104 to place the deposited silicon in a low resistivity state, as fabricated. Such a low resistivity state allows for easier programming of memory cell 100 as a large voltage is not required to switch the deposited silicon to a low resistivity state. For example, a silicide-forming metal layer 312 such as titanium or cobalt may be deposited on p+ polysilicon region 104c. In some embodiments, an additional nitride layer (not shown) may be formed at a top surface of silicide-forming metal layer 312. In particular, for highly reactive metals, such as titanium, an additional cap layer such as TiN layer may be formed on silicide-forming metal layer 312. Thus, in such embodiments, a Ti/TiN stack is formed on top of p+ polysilicon region 104c.

A rapid thermal anneal ("RTA") step may be performed to form silicide regions by reaction of silicide-forming metal layer 312 with p+ region 104c. In some embodiments, the RTA may be performed at about 540° C. for about 1 minute, and causes silicide-forming metal layer 312 and the deposited silicon of diode 104 to interact to form silicide layer 310, consuming all or a portion of the silicide-forming metal layer 312. As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 310 enhances the crystalline structure of silicon diode 104 during annealing). In addition, decreased defectivity in the polysilicon improves the diode's forward current. Similar results may be achieved for silicon-germanium alloy and/or germanium diodes.

In embodiments in which a nitride layer was formed at a top surface of silicide-forming metal layer 312, following the RTA step, the nitride layer may be stripped using a wet chemistry. For example, if silicide-forming metal layer 312 includes a TiN top layer, a wet chemistry (e.g., ammonium hydroxide, hydrogen peroxide, water in a 1:1:1 ratio) may be used to strip any residual TiN.

Although the example embodiment illustrated in FIG. 3 shows MIM stack 302 below diode 104 and sidewall collar 110, persons of ordinary skill in the art will understand that MIM stack 302 alternatively may be positioned above diode 104 and sidewall collar 110.

Example Fabrication Processes for Memory Cells

Referring now to FIGS. 4A-4I, a first example method of forming a memory level in accordance with this invention is described. As will be described below, the memory level includes a plurality of memory cells that each include a steering element coupled in series with a memory element. Additional memory levels may be fabricated above the first memory level (as described previously with reference to FIGS. 2B-2C).

With reference to FIG. 4A, substrate 400 is shown as having already undergone several processing steps. Substrate 400 may be any suitable substrate such as a silicon, germanium, silicon-germanium, undoped, doped, bulk, silicon-on-insulator ("SOI") or other substrate with or without additional circuitry. For example, substrate 400 may include one or more n-well or p-well regions (not shown).

Isolation layer 402 is formed above substrate 400. In some embodiments, isolation layer 402 may be a layer of silicon dioxide, silicon nitride, silicon oxynitride or any other suitable insulating layer.

Following formation of isolation layer 402, an adhesion layer 404 is formed over isolation layer 402 (e.g., by physical vapor deposition or another method). For example, adhesion layer 404 may be about 20 to about 500 angstroms, and preferably about 100 angstroms, of titanium nitride or another suitable adhesion layer such as tantalum nitride, tungsten, tungsten nitride, molybdenum, combinations of one or more adhesion layers, or the like. Other adhesion layer materials and/or thicknesses may be employed. In some embodiments, adhesion layer 404 may be optional.

After formation of adhesion layer 404, a conductive layer 406 is deposited over adhesion layer 404. Conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), physical vapor deposition ("PVD"), etc.). In at least one embodiment, conductive layer 406 may comprise about 200 to about 2500 angstroms of tungsten. Other conductive layer materials and/or thicknesses may be used.

Following formation of conductive layer 406, adhesion layer 404 and conductive layer 406 are patterned and etched. For example, adhesion layer 404 and conductive layer 406 may be patterned and etched using conventional lithography techniques, with a soft or hard mask, and wet or dry etch processing. In at least one embodiment, adhesion layer 404 and conductive layer 406 are patterned and etched to form substantially parallel, substantially co-planar first conductors 106. Example widths for first conductors 106 and/or spacings between first conductors 106 range from about 200 to about 2500 angstroms, although other conductor widths and/or spacings may be used.

After first conductors 106 have been formed, a dielectric layer 316a is formed over substrate 400 to fill the voids between first conductors 106. For example, approximately 3000-7000 angstroms of silicon dioxide may be deposited on the substrate 400 and planarized using chemical mechanical polishing or an etchback process to form a planar surface 410. Planar surface 410 includes exposed top surfaces of first conductors 106 separated by dielectric material (as shown). Other dielectric materials such as silicon nitride, silicon oxynitride, low k dielectrics, etc., and/or other dielectric layer thicknesses may be used. Example low k dielectrics include carbon doped oxides, silicon carbon layers, or the like.

In other embodiments of the invention, first conductors 106 may be formed using a damascene process in which dielectric layer 316a is formed, patterned and etched to create openings or voids for first conductors 106. The openings or voids then may be filled with adhesion layer 404 and conductive layer 406 (and/or a conductive seed, conductive fill and/or barrier layer if needed). Adhesion layer 404 and conductive layer 406 then may be planarized to form planar surface 410. In such an embodiment, adhesion layer 404 will line the bottom and sidewalls of each opening or void.

Figure 4B:
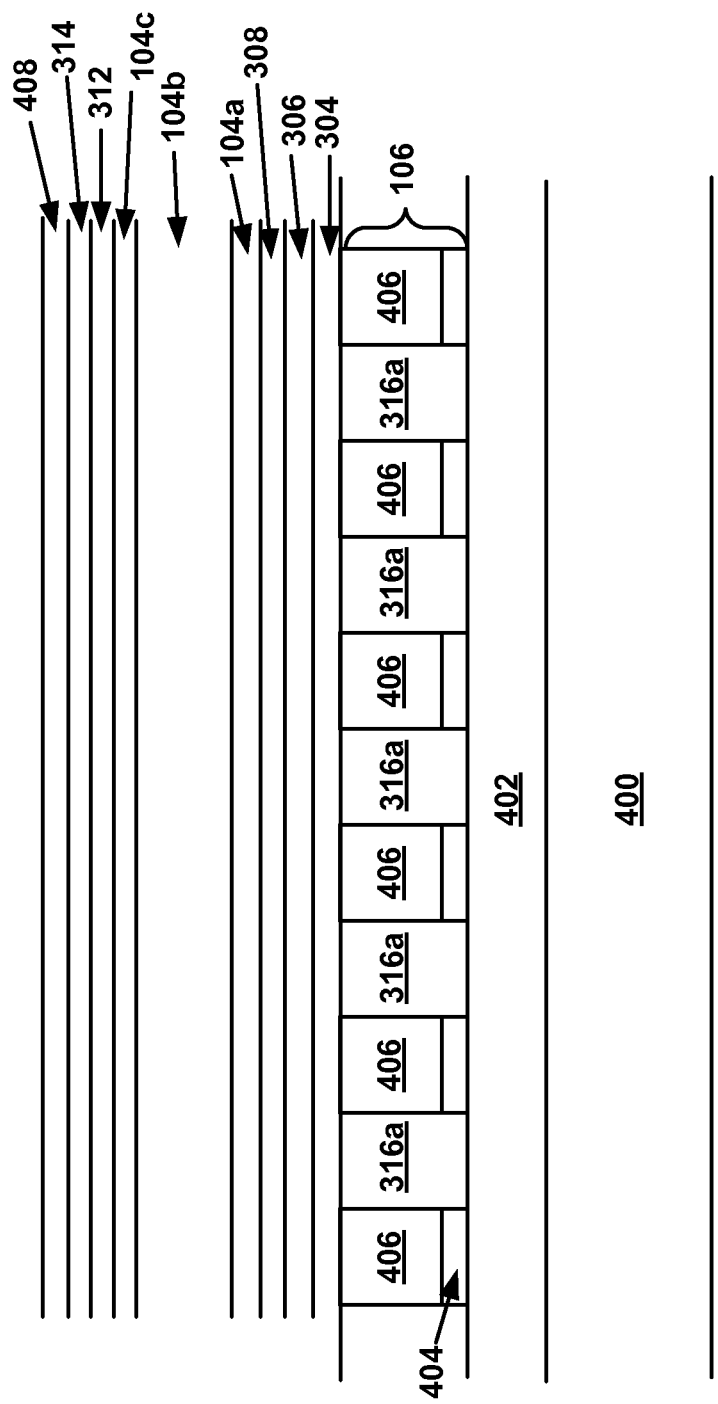

With reference to FIG. 4B, following planarization, a barrier layer 304 is formed over planarized top surface 410 of substrate 400. Barrier layer 304 may be about 2 to about 100 nanometers, preferably about 2 to about 10 nanometers, and more preferably about 5 nanometers, of titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 304, storage element material 306 is formed above barrier layer 304. For example, in some embodiments, storage element material 306 may be a dielectric rupture antifuse layer formed from about 2 to about 100 nanometers, preferably about 2 to about 10 nanometers, and more preferably about 4 nanometers, of hafnium dioxide ("HfO$_2$"). Other example dielectric rupture antifuse materials include silicon dioxide, as well as other high-k dielectrics such as Al$_2$O$_3$, ZrO$_2$, TiO$_2$, La$_2$O$_3$, Ta$_2$O$_5$, RuO$_2$, ZrSiO$_x$, AlSiO$_x$, HfSiO$_x$, HfAlO$_x$, HfSiON, ZrSiAlO$_x$, HfSiAlO$_x$, HfSiAlON, or ZrSiAlON, deposited, for example by atomic layer deposition. In some embodiments, if HfO$_2$ is used, storage element material 306 preferably has a thickness between about 5 and about 100 angstroms, preferably about 40 angstroms. If Al$_2$O$_3$ is used, storage element material 306 preferably has a thickness between about 5 and about 80 angstroms, preferably about 30 angstroms. In other embodiments, storage element material 306 may be a resistivity-switching element. For example, a binary metal oxide may be used, such as Ni$_x$O$_y$, Nb$_x$O$_y$, Ti$_x$O$_y$, Hf$_x$O$_y$, Al$_x$O$_y$, Mg$_x$O$_y$, Co$_x$O$_y$, Cr$_x$O$_y$, V$_x$O$_y$, Zn$_x$O$_y$, Zr$_x$O$_y$, B$_x$N$_y$, or Al$_x$N$_y$, as described in Herner et al., U.S. patent application Ser. No. 11/395,995, "Nonvolatile Memory Cell Comprising a Diode and a Resistance-Switching Material," filed Mar. 31, 2006, and hereby incorporated by reference herein in its entirety for all purposes. Other resistivity-switching materials include carbon films such as amorphous carbon ("aC") containing nanocrystalline graphene (referred to herein as "graphitic carbon"), graphene, graphite, carbon nanotubes, amorphous diamond-like carbon ("DLC"), silicon carbide, boron carbide and other similar carbon-based materials.

An additional barrier layer 308 is formed over storage element material 306. Barrier layer 308 may be about 2 to about 100 nanometers, preferably about 2 to about 10 nanometers, and more preferably about 5 nanometers, of titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Above barrier layer 308, deposition of the semiconductor material used to form the diode of each memory cell begins (e.g., diode 104 in FIG. 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 308, a heavily doped n+ silicon layer 104a is deposited on barrier layer 308. In some embodiments, n+ silicon layer 104a is in an amorphous state as deposited. In other embodiments, n+ silicon layer 104a is in a polycrystalline state as deposited. CVD or another suitable process may be employed to deposit n+ silicon layer 104a. In at least one embodiment, n+ silicon layer 104a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 104a may be doped in situ, for example, by flowing a donor gas during deposition. Other doping methods may be used (e.g., implantation).

After deposition of n+ silicon layer 104a, a lightly doped, intrinsic and/or unintentionally doped silicon layer 104b may be formed over n+ silicon layer 104a. In some embodiments, intrinsic silicon layer 104b may be in an amorphous state as deposited. In other embodiments, intrinsic silicon layer 104b may be in a polycrystalline state as deposited. CVD or another suitable deposition method may be employed to deposit intrinsic silicon layer 104b. In at least one embodiment, intrinsic silicon layer 104b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 104a prior to depositing intrinsic silicon layer 104b to prevent and/or reduce dopant migration from n+ silicon layer 104a into intrinsic silicon layer 104b (as described in the '331 Application, previously incorporated).

Heavily doped, p-type silicon layer 104c may be formed by either depositing and doping silicon by ion implantation or by doping silicon in-situ during deposition. For example, a blanket p+ implant may be employed to implant boron a predetermined depth within intrinsic silicon layer 104b. Example implantable molecular ions include BF$_2$, BF$_3$, B and the like. In some embodiments, an implant dose of about $1$-$5\times10^{15}$ ions/cm$^2$ may be employed. Other implant species and/or doses may be used. Further, in some embodiments, a diffusion process may be employed. In at least one embodiment, the resultant p+ silicon layer 104c has a thickness of about 100-700 angstroms, although other p+ silicon layer sizes may be used.

Following formation of p+ silicon layer 104c, a silicide-forming metal layer 312 is deposited over p+ silicon layer 104c. Example silicide-forming metals include sputter or otherwise deposited titanium or cobalt. In some embodiments, silicide-forming metal layer 312 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 312.

Following formation of silicide-forming metal layer 312, an RTA step may be performed at about 540° C. for about one minute to form silicide layer 310 (shown in FIG. 3), consuming all or a portion of the silicide-forming metal layer 312. Following the RTA step, any residual nitride layer from silicide-forming metal layer 312 may be stripped using a wet chemistry, as described above.

In some embodiments, following the RTA step and the nitride strip step, a barrier layer 314 is formed over silicide-forming metal layer 312. Barrier layer 314 may be about 5 to about 800 angstroms, and preferably about 100 angstroms, of titanium nitride or another suitable barrier layer such as tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

A hard mask layer 408, such as silicon dioxide ("SiO$_2$"), silicon nitride, or another suitable material, is formed over barrier layer 314. Hard mask layer 408 may be used during etching of the underlying barrier, diode, and storage element layers as described below. In some embodiments, hard mask layer 408 may comprise between about 10 and about 300 nanometers, preferably between about 30 and about 100 nanometers, and more preferably about 50 nanometers of silicon dioxide. Other hard mask layer materials and/or thicknesses may be used.

After the various layers of material used to form memory cells are formed above substrate 400, the layers are etched to form pillars. As discussed above, there is a risk that after pillars are formed and before gap fill material is deposited to isolate the pillars from one another, one or more pillars may lean or fall and contact an adjacent pillar. Contact between adjacent pillars can cause the memory cell array to be defective and is therefore undesirable.

Thus, in accordance with embodiments of the invention, an insulating collar or spacer is provided around a portion of each memory cell pillar. The insulating collar may strengthen each pillar, making each pillar less likely to lean and/or touch another pillar. The insulating collar may also help insulate each pillar.

Figure 4C:
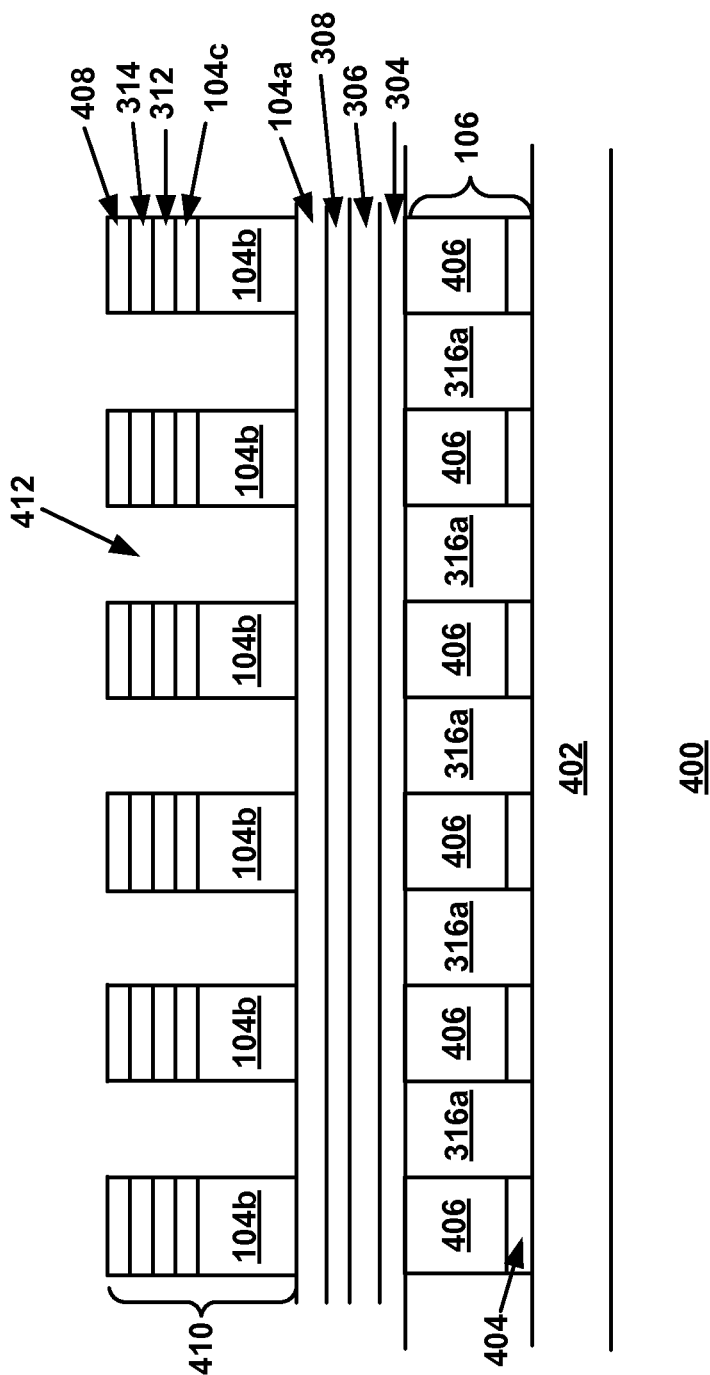

Referring now to FIG. 4C, hard mask layer 408, barrier layer 314, silicide-forming metal layer 312, and a desired thickness of diode regions 104c, 104b and/or 104a are patterned and etched to form partially-etched pillars 410 separated by vias 412. In some embodiments, all of diode regions 104a-c may be etched into pillars, whereas in other embodiments, only a portion of diode regions 104a-c are etched into pillars. Any desired amount (height) of diode material may be etched at this stage to set the height of the sidewall collar to be formed. In yet other embodiments, all of diode regions 104a-c and one or more of barrier layer 308, storage element material 306 and/or barrier layer 304 may also be etched.

The respective diode regions (and any other layers to be etched) may be patterned and etched with hard mask layer 408, or separately after hard mask layer 408 has been patterned and etched. For example, hard mask layer 408, barrier layer 314, silicide-forming metal layer 312, and a desired thickness of diode material may be patterned and etched. In one embodiment, hard mask layer 408, barrier layer 314, silicide-forming metal layer 312, and about 200 nanometers of diode material may be etched. In other embodiments, other thicknesses of diode material may be etched. For convenience, in FIG. 4C, all of the diode material of diode regions 104c and 104b is shown as being etched and diode region 104a remains unetched. However, as stated, any amount of diode material, including all diode material, may be so etched.

Hard mask layer 408, barrier layer 314, silicide-forming metal layer 312, and a desired thickness of diode material may be etched using wet or dry etch processing, or other similar etching techniques. Any suitable etch chemistries, and any suitable etch parameters may be used. In some embodiments, layers 314, 312, and a desired amount of diode material may be patterned using a single etch step. In other embodiments, separate etch steps may be used.

In some embodiments, pillars 410 may have about the same pitch and about the same width as first conductors 106 below, such that each pillar 410 is formed over a first conductor 106. Some misalignment may be tolerated.

In some embodiments, the hard mask layer 408 may be eliminated. Photoresist may be deposited, and patterned using standard photolithography techniques. Layers 314, 312 and a desired amount of diode material may be etched, and then the photoresist may be removed. Similarly, dielectric antireflective coating ("DARC") may be used as a hard mask. For example, layers 314, 312 and a desired amount of diode material may be patterned and etched with about 1 to about 1.5 micron, more preferably about 1.2 to about 1.4 micron, of photoresist ("PR") using standard photolithographic techniques. Thinner PR layers may be used with smaller critical dimensions and technology nodes. In other embodiments, hard mask layer 408 (e.g., an oxide hard mask) may be used below the PR layer to improve pattern transfer and protect underlying layers during etching.

Partially-etched pillars 410 may be cleaned using a dilute hydrofluoric/sulfuric acid clean. Such cleaning, whether or not PR asking is performed before etching, may be performed in any suitable cleaning tool, such as a Raider tool, available from Semitool of Kalispell, Mont. Example post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used.

Optionally, the partially-etched pillars 410 may be oxidized to decrease leakage of the diodes formed by diode regions 104a-c.

Figure 4D:
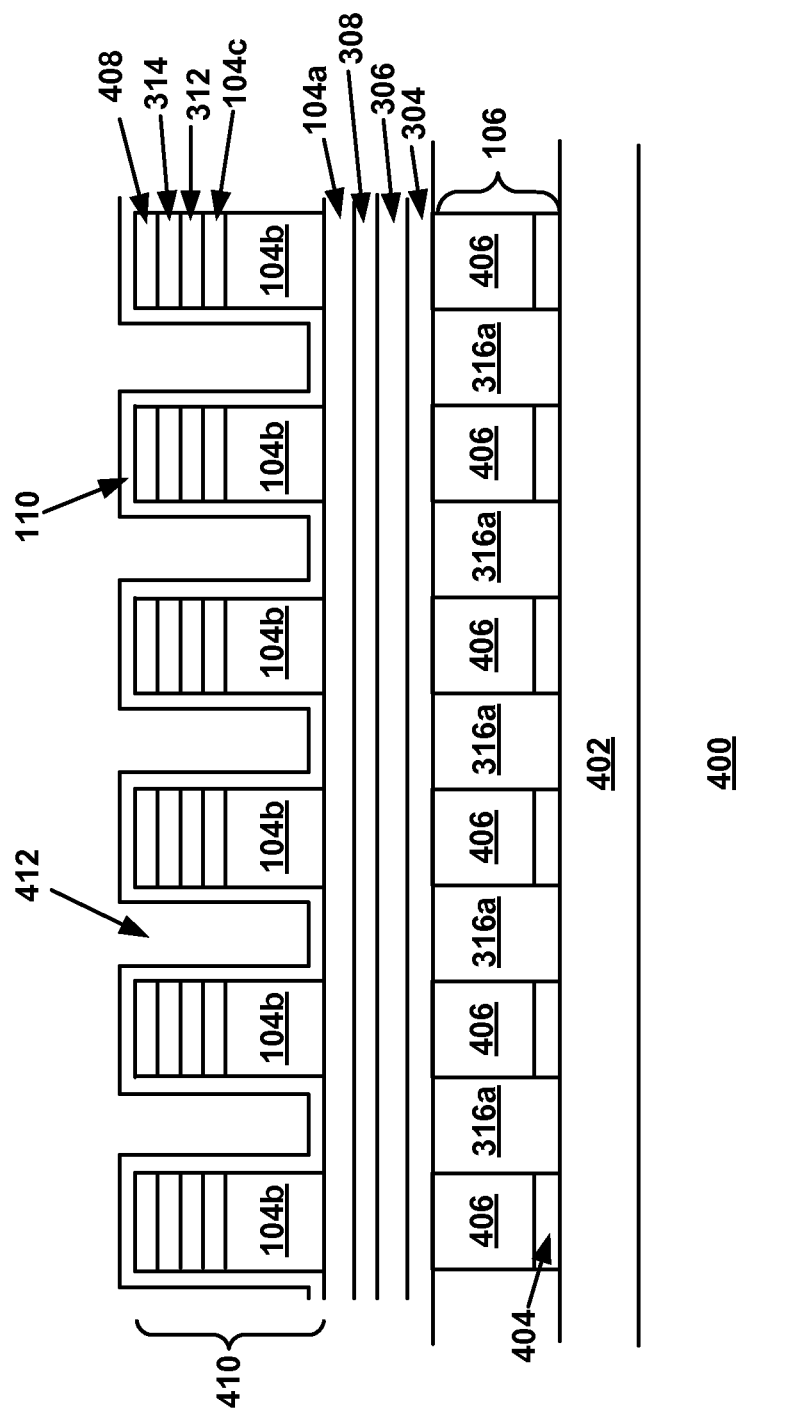

Referring to FIG. 4D, after pillars 410 have been formed and cleaned, a layer of collar material 110 is formed over pillars 410 (e.g., over the top, bottom and exposed sidewalls of pillars 410). In some embodiments, the collar material 110 may comprise Si$_x$N$_y$ or a similar material. Collar material 110 may have a thickness between about 1 and about 300 nanometers, preferably between about 5 and about 50 nanometers, and more preferably about 10 nanometers. Collar material 110 may include silicon nitride formed by LPCVD or other similar deposition technique. Alternatively, collar material 110 may include silicon carbide (e.g., formed by plasma-enhanced chemical vapor deposition or other similar techniques), a high k material such as HfO$_2$ (e.g., formed by atomic layer deposition or other similar techniques), combinations of the same, or the like.

As stated, collar material 110 may be stiffer than the diode material so that collar material 110 strengthens pillars 410 and prevents pillars 410 from tipping or leaning during memory cell fabrication (e.g., a steering element pillar may have a first stiffness and the collar formed along the pillar may have a second stiffness that is greater than the first stiffness).

Figure 4E:
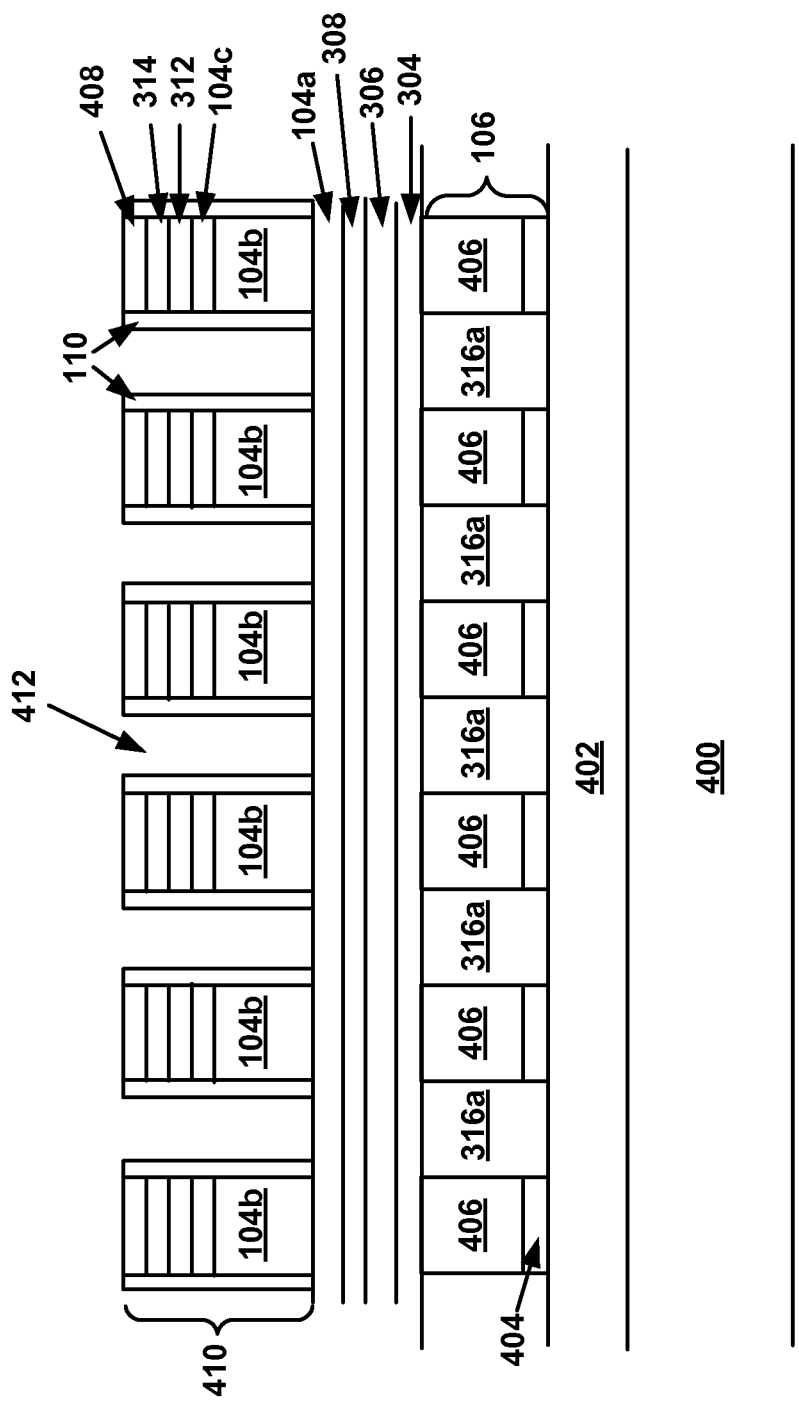

Referring to FIG. 4E, collar material 110 is etched to remove the collar material from the tops of pillars 410 and from the remaining polysilicon and MIM stack 412, leaving sidewall collar material 110 around pillars 410. For example, collar material 110 may be etched using any suitable wet or dry etch process. For example, Sang H. Dhong et al., "Sidewall Spacer Technology for MOS and Bipolar Devices, J. Electrochem. Soc. 133, 389-398 (1986), which is hereby incorporated by reference herein in its entirety for all purposes, describes a process for dry etching SiN in a plasma of CF$_4$+H$_2$. Although not shown in FIG. 4E, the top sidewall portion of collar material 110 may be thinned during the etch process (as shown in FIG. 3).

Figure 4F:
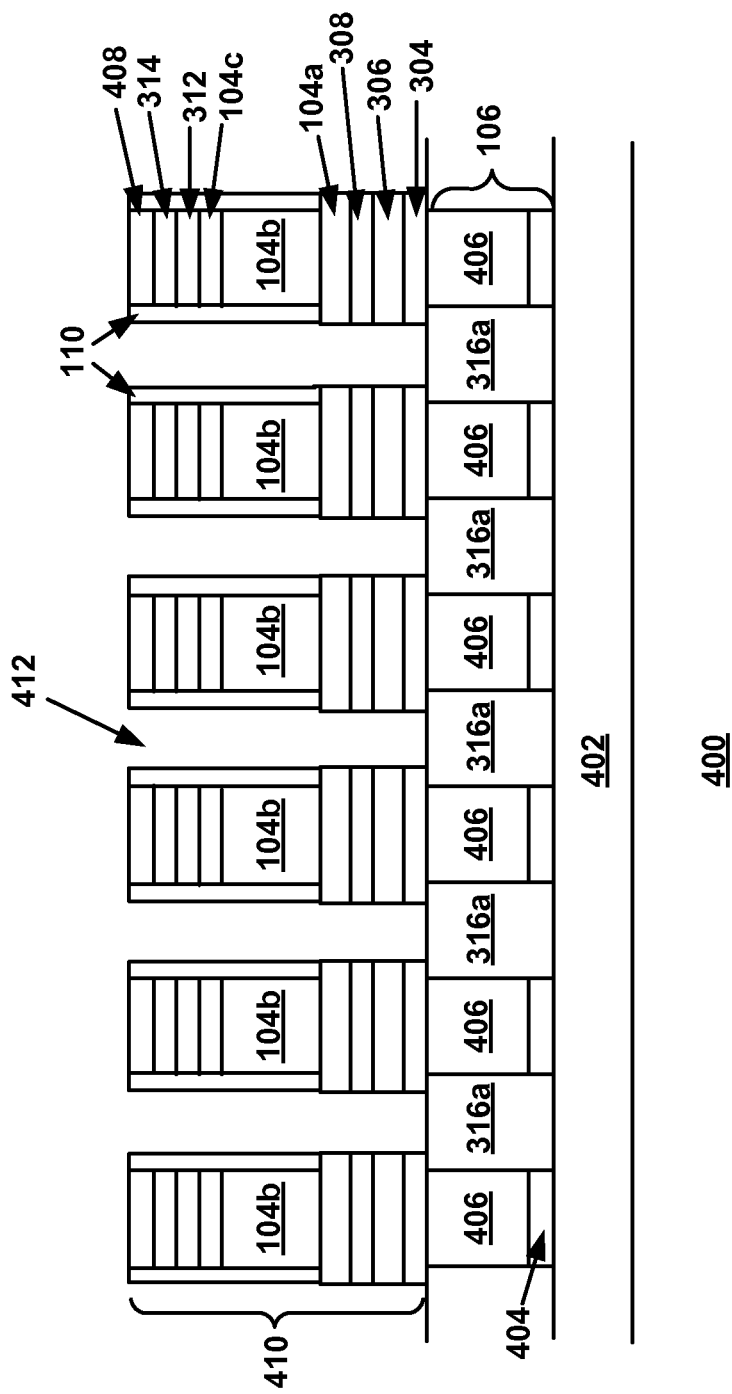
Figure 4G:
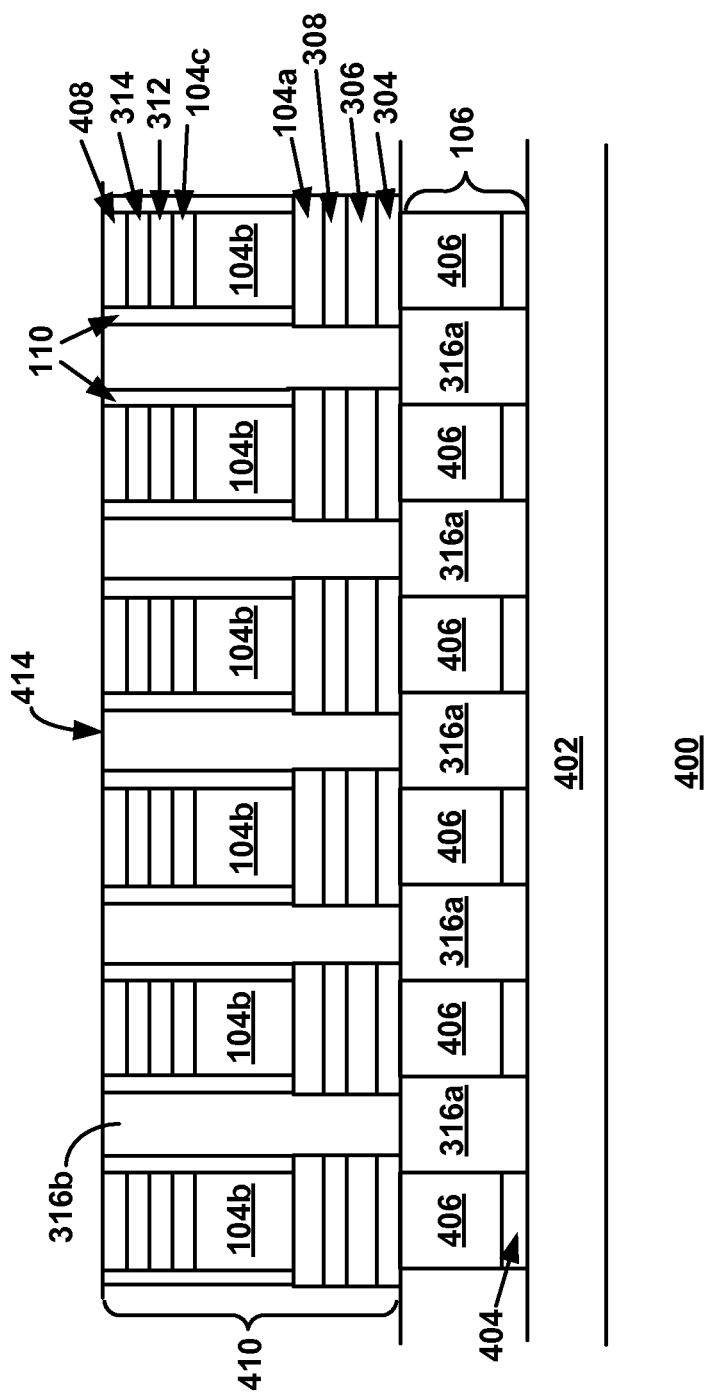

Referring now to FIG. 4F, an additional etching procedure is performed to etch the remaining diode material and the MIM stack 302 (e.g., etching through the diode layer 104a, in this example embodiment, barrier layer 304, storage material layer 306, and barrier layer 308, and stopping at dielectric layer 316a). Any suitable etch chemistries, and any suitable etch parameters, flow rates, chamber pressures, power levels, process temperatures, and/or etch rates may be used. In some embodiments, the remaining diode material and MIM stack 302 may be etched during the same etch step used to etch collar material 110; or a separate etch step may be used. In the example embodiment, hard mask layer 408 may be used to protect pillars 410 during the etching procedure. In this manner, pillars 410 are increased in height as shown.

A dielectric layer 316b may be deposited over pillars 410 to fill the voids between pillars 410. For example, approximately 200-7000 angstroms of silicon dioxide may be deposited and planarized using chemical mechanical polishing or an etchback process to remove excess dielectric material 316b and form a planar surface 414 resulting in the structure illustrated in FIG. 4G. Planar surface 414 includes exposed top surfaces of pillars 410 (including the top of hard mask layer 408) and sidewall collar material 110, separated by dielectric material 316b (as shown). Other dielectric materials such as silicon nitride, silicon oxynitride, low k dielectrics, etc., and/or other dielectric layer thicknesses may be used. Example low k dielectrics include carbon doped oxides, silicon carbon layers, or the like.

Sidewall collar material 110 slows the rate of chemical mechanical polishing of the dielectric gap fill material 316b as the collar material 110 is exposed. This slower rate of polish can improve manufacturing control. In some embodiments, the planarization procedure may substantially remove hard mask layer 408, exposing barrier layer 314.

Figure 4H:
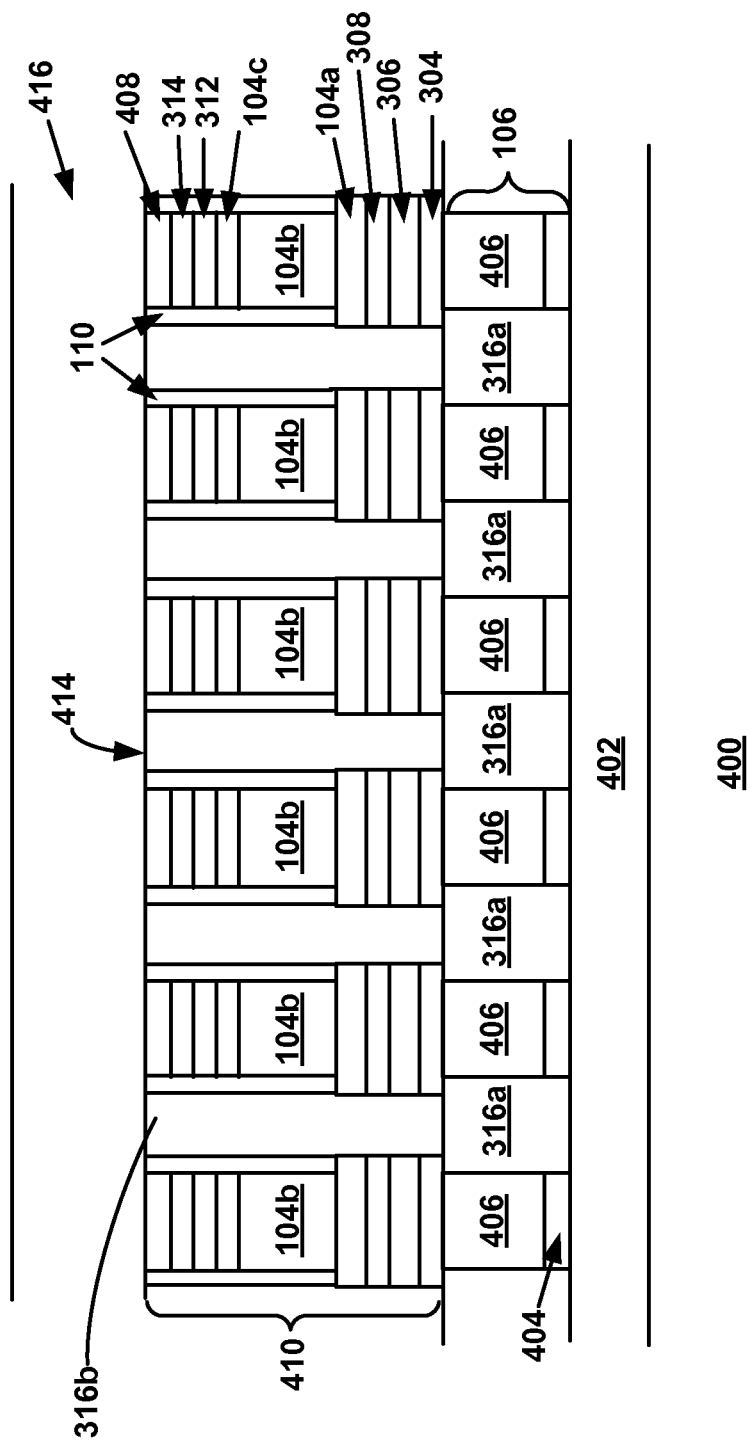

Second conductors 108 are formed above pillars 410. In the present example embodiment, a damascene technique may be used to form second conductors 108. Referring to FIG. 4H, a layer of a dielectric material 416, such as $SiO_2$, is formed over planar surface 414. For example, between about 500 and about 3000 angstroms of $SiO_2$ may be deposited. Other dielectric materials such as silicon nitride, silicon oxynitride, low k dielectrics, etc., and/or other dielectric layer thicknesses may be used.

Dielectric layer 416 is patterned and etched to create trenches (not shown in FIG. 4I, extending parallel to the paper, for example) above pillars 410 for conductors 108. Any suitable etch chemistries, and any suitable etch parameters, flow rates, chamber pressures, power levels, process temperatures, and/or etch rates may be used to etch dielectric layer 416. The etch step may also be used to remove hard mask layer 408 from each pillar 410. Removing hard mask layer 408 ensures that the second conductors 108 will be electrically coupled to diodes 104.

As stated, in the example embodiment shown, second conductors 108 are formed in a direction substantially perpendicular to first conductors 106. Therefore, the trenches in dielectric layer 416 are formed in a direction substantially perpendicular to first conductors 106, and are not shown in the figures.

Figure 4I:
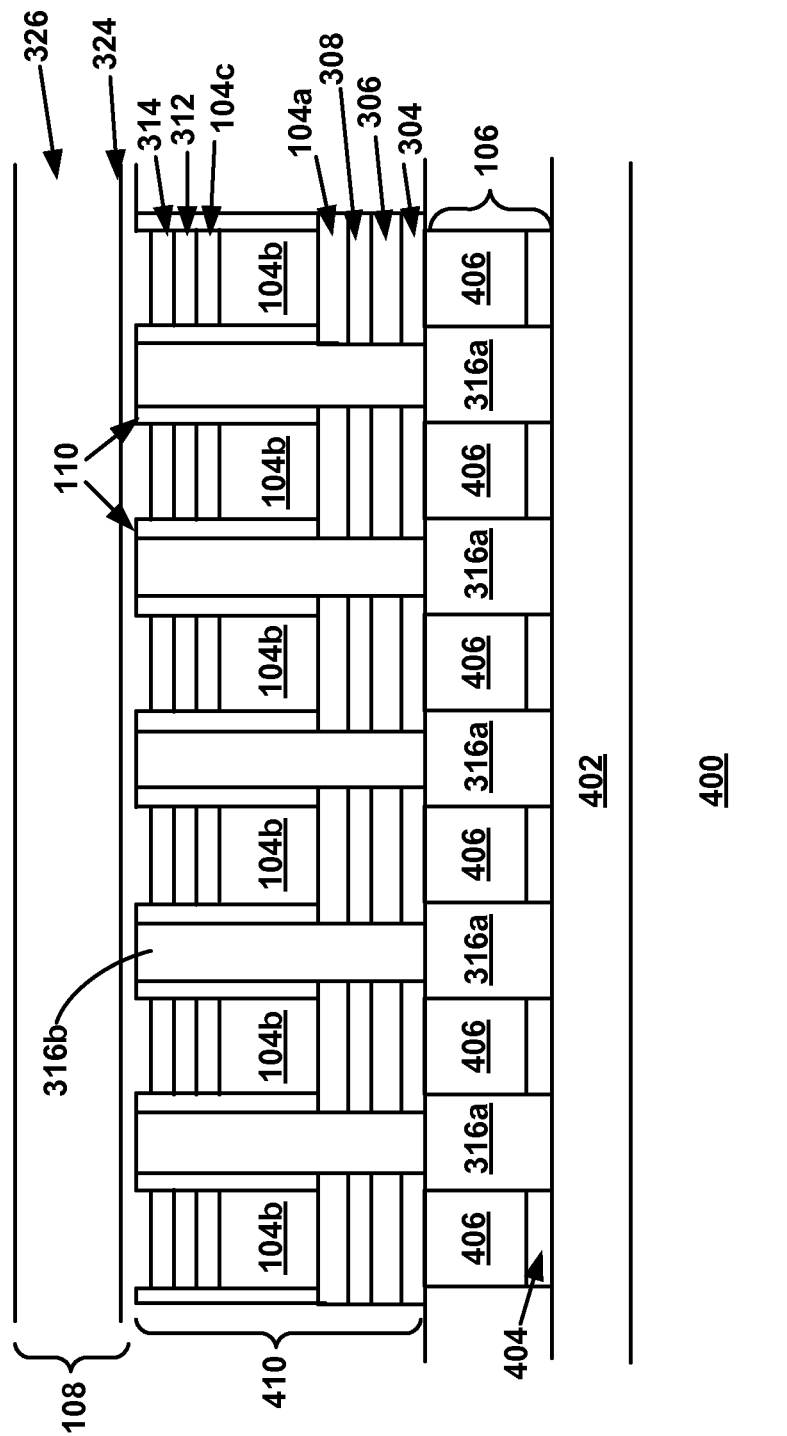

The material that will form second conductors 108 is formed above pillars 410. As shown in FIG. 4I, one or more barrier layers and/or adhesion layers 324 may be deposited in the trenches followed by a conductive layer 326 to form second conductors 108. Barrier layer 324 and conductive layer 326 then may be planarized to form a planar surface.

Conductive layer 326 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layer 324 may include titanium nitride or another suitable layer such as tantalum nitride, tungsten, tungsten nitride, molybdenum, combinations of one or more layers, or any other suitable material(s). In at least one embodiment, second conductors 108 are substantially parallel, substantially coplanar conductors that extend in a different direction than first conductors 106.

As described above with reference to FIG. 3, because the etch rate of collar material 110 is (much) slower than the etch rate of dielectric material 416 or 316b, collar material 110 reduces the chance of an inadvertent connection of the damascene conductors 108 to the side of pillars 410 which could short circuit one or more memory cells. Such short circuiting could otherwise occur due to misalignment between second conductors 108 and diodes 104 (see FIG. 3).

Following formation of second conductors 108, the resultant structure may be annealed to crystallize the deposited semiconductor material of diodes 104 (and/or to form silicide regions by reaction of the silicide-forming metal layer 312 with p+ region 104c). The lattice spacing of titanium silicide and cobalt silicide are close to that of silicon, and it appears that such silicide regions may serve as "crystallization templates" or "seeds" for adjacent deposited silicon as the deposited silicon crystallizes (e.g., silicide regions enhance the crystalline structure of silicon diode 104 during annealing). Lower resistivity diode material thereby is provided. Similar results may be achieved for silicon-germanium alloy and/or germanium diodes.

In at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Persons of ordinary skill in the art will understand that alternative memory cells in accordance with this invention may be fabricated using other similar techniques.

The foregoing description discloses only example embodiments of the invention. Modifications of the above disclosed apparatus and methods which fall within the scope of the invention will be readily apparent to those of ordinary skill in the art.

Accordingly, although the present invention has been disclosed in connection with example embodiments thereof, it should be understood that other embodiments may fall within the spirit and scope of the invention, as defined by the following claims.

The invention claimed is:

1. A memory cell comprising:
   a steering element pillar having a sidewall and a steering element;
   a sidewall collar formed along at least a portion of the sidewall of the steering element pillar, wherein the sidewall collar does not extend laterally beyond a widest portion of the steering element; and
   a memory element coupled to the steering element pillar.

2. The memory cell of claim 1, wherein the steering element pillar comprises a polycrystalline diode.

3. The memory cell of claim 1, wherein the sidewall collar comprises a dielectric material.

4. The memory cell of claim 1, wherein the sidewall collar comprises one or more of silicon nitride, hafnium dioxide and silicon carbide.

5. The memory cell of claim 1, wherein the sidewall collar has a thickness between about 5 and 200 nm.

6. The memory cell of claim 1, wherein the memory element comprises a metal-insulator-metal ("MIM") stack.

7. The memory cell of claim 6, wherein the MIM stack includes a dielectric rupture antifuse.

8. The memory cell of claim 6, wherein the MIM stack includes a resistivity-switching material.

9. A memory array comprising:
a plurality of steering element pillars, each having a sidewall and a steering element;
a plurality of sidewall collars, each formed along at least a portion of the sidewall of a respective one of the steering element pillars, wherein each sidewall collar does not extend laterally beyond a widest portion of a respective steering element; and
a plurality of memory elements, each coupled to a respective one of the steering element pillars.

10. The memory array of claim 9, wherein each steering element pillar comprises a polycrystalline diode.

11. The memory array of claim 9, wherein each sidewall collar comprises a dielectric material.

12. A memory cell comprising:
a steering element pillar having a first stiffness and a sidewall;
a sidewall collar formed along at least a portion of the sidewall of the steering element pillar, the sidewall collar having a second stiffness, wherein the second stiffness is greater than the first stiffness; and
a memory element coupled to the steering element pillar.

13. The memory cell of claim 12, wherein the steering element pillar comprises polycrystalline semiconductor material.

14. The memory cell of claim 12, wherein the steering element pillar comprises a P-I-N, P-N, N-I-P or N-P diode.

15. The memory cell of claim 12, wherein the sidewall collar comprises dielectric material.

16. The memory cell of claim 12, wherein the dielectric material comprises one or more of silicon nitride, hafnium dioxide and silicon carbide.

17. The memory cell of claim 12, wherein the memory element includes an MIM stack having a resistivity-switching material.

18. A memory array comprising:
a plurality of steering element pillars each having a first stiffness and a sidewall;
a sidewall collar along at least a portion of the sidewall of each steering element pillar, each sidewall collar having a second stiffness, wherein the second stiffness is greater than the first stiffness; and
a plurality of memory elements each coupled to a different one of the steering element pillars.

19. The memory array of claim 18, wherein each steering element pillar comprises a P-I-N, P-N, N-I-P or N-P diode.

20. The memory array of claim 18, wherein each sidewall collar comprises one or more of silicon nitride, hafnium dioxide and silicon carbide.

* * * * *